United States Patent
Brodie

(10) Patent No.: US 7,928,811 B2
(45) Date of Patent: Apr. 19, 2011

(54) SYSTEM AND METHOD FOR USE OF A SWITCHED MODE TCXO FOR RECEIVER APPLICATIONS

(75) Inventor: Keith Brodie, Irvine, CA (US)

(73) Assignee: SiRF Technologies, Inc., San Jose, CA (US)

(*) Notice: Subject to any disclaimer, the term of this patent is extended or adjusted under 35 U.S.C. 154(b) by 100 days.

(21) Appl. No.: 12/341,502

(22) Filed: Dec. 22, 2008

(65) Prior Publication Data
US 2010/0156545 A1    Jun. 24, 2010

(51) Int. Cl.
*H03B 5/32* (2006.01)
*H03B 5/36* (2006.01)
*H03L 1/02* (2006.01)
*H04B 1/00* (2006.01)

(52) U.S. Cl. .......... 331/158; 331/66; 331/176; 331/179; 455/258

(58) Field of Classification Search .................... 331/65, 331/66, 69, 70, 116 R, 116 FE, 158, 159, 331/175, 176, 177 R, 177 V, 179; 455/255, 257, 258

See application file for complete search history.

(56) References Cited

U.S. PATENT DOCUMENTS

| 5,204,975 | A  | * | 4/1993 | Shigemori | .................... 455/231 |
| 7,583,157 | B2 | * | 9/2009 | Sakurai    | .......................... 331/176 |

* cited by examiner

*Primary Examiner* — David Mis
(74) *Attorney, Agent, or Firm* — Haynes & Boone, LLP.

(57) ABSTRACT

Systems and methods are disclosed herein for using a switched mode TCXO or VC-TCXO in a satellite navigation receiver where the switched mode TCXO or VC-TCXO may operate either in an active compensation mode to compensate for temperature induced frequency error or in a second fixed compensation mode where the TCXO or VC-TCXO is not compensated for temperature. The switched mode TCXO or VC-TCXO is operated in the active compensation mode when satellite acquisition performance may be improved from a reduction in the range of oscillator frequency error. The switched mode TCXO or VC-TCXO may be switched to operate in the fixed compensation mode when satellite tracking performance is sensitive to discontinuities in the phase, frequency, and/or frequency rate of the oscillator clock when temperature compensation is applied.

9 Claims, 3 Drawing Sheets

SYSTEM AND METHOD FOR USE OF A SWITCHED MODE TCXO FOR RECEIVER APPLICATIONS

TECHNICAL FIELD

The present disclosure relates generally to a system and a method for using a temperature-compensated crystal oscillator (TCXO) or a voltage-controlled temperature-compensated crystal oscillator (VC-TCXO) in a communication or radio-navigation receiver to detect and track received signals. More particularly, the present disclosure relates to a system and a method for switching the operating mode of the TXCO or the VC-TCXO to improve acquisition and tracking of received signals in a radio navigation receiver.

BACKGROUND

Many communication and radio-navigation systems employ receivers wherein signals are tracked coherently. Coherent tracking receivers seek to preserve the phase of the signals when knowledge of the phase may be necessary for data demodulation or for improving receiver performance. For example, a receiver for the satellite-based Global Positioning System (GPS) performs coherent integration of the signals to enable coherent tracking in order to improve receiver sensitivity. Coherent tracking requires that the crystal oscillator generating the receiver clock be relatively stable during the coherent integration interval. However, many receivers use TCXO or VC-TCXO as their reference oscillator because the temperature compensation feature of the TCXO or the VC-TCXO reduces the frequency uncertainty of the reference oscillator and thus, the search range required to find signals of interest during acquisition. As such, compensating for temperature changes to support fast acquisition may adversely affect the results of coherent integration in tracking if a change in the oscillator frequency is induced by the compensation network during the integration interval. For example, initiating temperature compensation or changing the compensation in the TCXO or the VC-TCXO may introduce phase, frequency, and/or frequency-rate discontinuities to the receiver oscillator. Such oscillator discontinuities, if they occur during the coherent integration period of the GPS receiver, may degrade tracking performance and reduce receiver sensitivity. To avoid this problem temperature compensation may be initiated between periods of coherent integrations. However, for multi-channel GPS receivers where coherent integration periods of the multiple tracking channels may overlap, it may be difficult to find any gap in the coherent integration periods when no channel is running coherent integration to initiate temperature compensation so as to avoid generating oscillator discontinuities. Even non-coherent tracking receivers are not immune from receiver oscillator discontinuities. Non-coherent tracking receivers do not preserve the phase of the signal for data demodulation and are generally more tolerant of receiver oscillator discontinuities. However, phase, frequency, and/or frequency-rate discontinuities on the receiver oscillator may also degrade tracking performance of non-coherent receivers if the discontinuities are too great.

Therefore, it is desirable to have a single TCXO or VC-TCXO that combines the advantage of an oscillator with a reduced range of frequency error over temperature with the flexibility to generate an oscillator without discontinuities when no temperature compensation is desired.

BRIEF SUMMARY

Systems and methods are disclosed herein for a switched mode TCXO or VC-TCXO that operates in an active compensation mode to compensate the oscillator for temperature induced frequency error and a second fixed compensation mode to disable temperature compensation. Systems and methods are also disclosed for a switched mode VC-TCXO that operates in a transparent mode to allow change to the oscillator and a latched mode to prevent change to the oscillator. The TCXO may operate in the active compensation mode when the receiver is able to withstand discontinuities to the phase, frequency, and/or frequency-rate of the oscillator, such as during signal acquisition. The TCXO is switched to operate in the fixed compensation mode when such discontinuities may degrade tracking performance, such as during coherent integration intervals. Similarly, the VC-TCXO may operate in the transparent mode when it is desirable to change the oscillator frequency or phase to maintain communication with a network. The VC-TCXO may be switched to the latched mode when it is critical to prevent change to the oscillator. The flexibility to switch between the operating modes allows the receiver to benefit from a reduced oscillator frequency error or a faster oscillator frequency switching time, resulting in faster signal acquisition time, and still allows the receiver to operate in modes requiring a discontinuity-free oscillator.

In accordance with one or more embodiments of the present invention, a switched mode TCXO or a switched mode VC-TCXO includes a TCXO or a VC-TCXO to generate a reference clock and a switch to control an operating mode of the TCXO or the VC-TCXO. The TCXO or VC-TCXO may operate in either the active compensation mode or the fixed compensation mode. When the switch puts the TCXO or the VC-TCXO in the active compensation mode, the TCXO or the VC-TCXO compensates the reference clock for any temperature induced frequency error. When the switch puts the TCXO or the VC-TCXO in the fixed compensation mode, the TCXO or the VC-TCXO does not compensate the reference clock for any temperature induced frequency error, eliminating any discontinuities in the reference clock.

In accordance with one or more embodiments of the present invention, a receiver with a switched mode TCXO or VC-TCXO includes a receiver subsystem that controls the operating mode of the TCXO or VC-TCXO. The receiver subsystem may put the switched mode TCXO or VC-TCXO into the active compensation mode when it is desirable to compensate for temperature induced frequency error of the reference clock, and when the coherent receiver is able to withstand discontinuities to the phase, frequency or frequency-rate of the reference clock. The receiver subsystem may operate the TCXO or VC-TCXO in the fixed compensation mode when discontinuities to the clock are undesirable, such as when the receiver subsystem performs coherent integration.

In accordance with one or more embodiments of the present invention, a switched mode VC-TCXO includes a VC-TCXO and a latch. The switched mode VC-TCXO may operate in the transparent mode or the latched mode. In the transparent mode the control voltage to the VC-TCXO follows an input voltage to the latch to allow change to the oscillator clock. In the latched mode the control voltage is held at a previously latched value at the latch to prevent change to the oscillator clock.

In accordance with one or more embodiments of the present invention, a receiver with a switched mode VC-TCXO includes a first receiver subsystem that generates the control voltage for the VC-TCXO and a second receiver subsystem that controls the operating mode of the VC-TCXO. The second receiver subsystem may put the switched mode VC-TCXO into the transparent mode when it is desirable to allow the first receiver subsystem to change the oscillator clock, and when the second coherent receiver is able to withstand discontinuities to the phase, frequency or frequency-rate of the oscillator clock. The second receiver subsystem may operate the VC-TCXO in the latched compensation mode when discontinuities to the clock are undesirable, such as when the second receiver subsystem performs coherent integration.

These and other embodiments of the present invention will be more fully understood by reference to the following detailed description when considered in conjunction with the following drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

A system and a method are disclosed herein for using a switched mode TCXO or VC-TCXO in a receiver. The switched mode TCXO or VC-TCXO has two modes of operation, an active compensation mode and a fixed compensation mode. The active compensation mode allows the TCXO or the VC-TCXO to be compensated regularly in response to temperature variation to reduce the range of frequency uncertainty over temperature. However, temperature compensation may introduce phase, frequency, and/or frequency discontinuities to the reference clock output of the TCXO or the VC-TCXO. Alternatively, the TCXO or VC-TCXO may operate in the fixed compensation mode where no temperature compensation is performed so that the TCXO or the VC-TCXO behaves like an uncompensated crystal oscillator (XO). In the fixed compensation mode no discontinuities is introduced to the reference clock but there is a greater frequency uncertainty on the reference clock in response to temperature variation.

In addition, a switched-mode VC-TCXO has a transparent mode to allow change to the oscillator and a latched mode to prevent change to the oscillator. The VC-TCXO may operate in the transparent mode when it is desirable to change the oscillator frequency or phase to maintain communication with a network and when the receiver is able to withstand discontinuities to the phase, frequency, and/or frequency-rate of the oscillator. The VC-TCXO may be switched to the latched mode when it is critical to prevent discontinuity to the oscillator.

Figure 1:
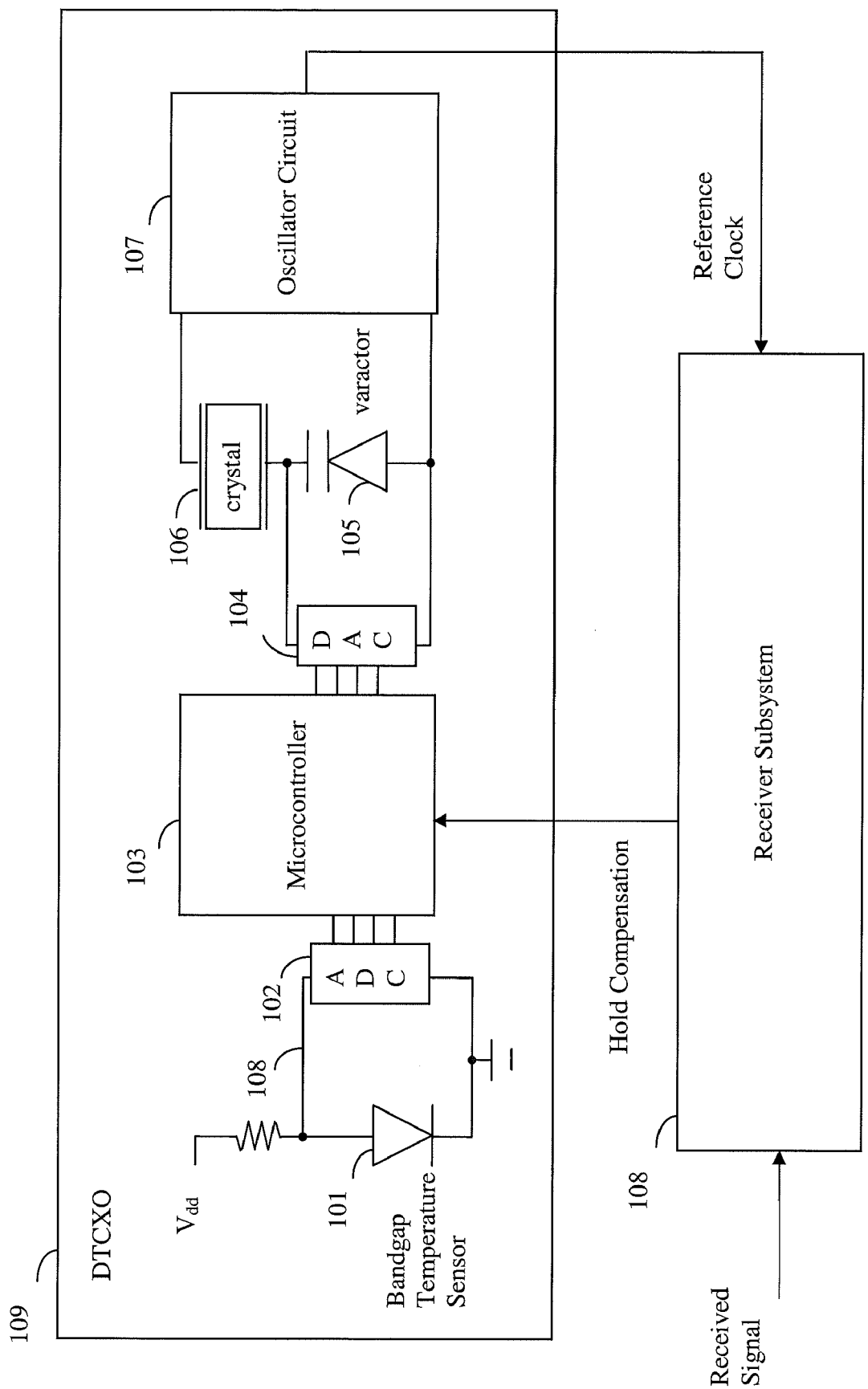
FIG. 1 shows a top level block diagram of a receiver depicting a switched mode digital TCXO or VC-TCXO (DTCXO) under the control of a receiver subsystem according to one or more embodiments of the present disclosure.

FIG. 1 shows a top level block diagram of a receiver depicting a switched mode digital TCXO or VC-TCXO (DTCXO) 109 under the control of a receiver subsystem 108 according to one or more embodiments of the present disclosure. The switched mode DTCXO 109 may include a bandgap temperature sensor 101, an analog to digital converter (ADC) 102, a microcontroller 103, a digital to analog converter (DAC) 104, a varactor or variable capacitance diode 105, a crystal 106, and an oscillator circuit 107. The DTCXO 109 may have a hold compensation input that controls its operating mode. The DTCXO 109 generates the reference clock for the receiver subsystem 108. The receiver subsystem 108 uses the reference clock from the DTCXO for generating all the clocks it requires to detect and track the received signal. The receiver subsystem 108 also generates the hold compensation signal.

Referring to the DTCXO 109 of FIG. 1, the bandgap temperature sensor 101 senses the temperature to generate a bandgap voltage 108 that varies as a function of temperature. The ADC 102 quantizes the bandgap voltage 108 to digital values for reading by the microcontroller 103. The microcontroller 103 stores data that characterize the uncompensated frequency error of the reference clock output as a function of the bandgap voltage. By reading the digitized bandgap voltage from the ADC 102 and the characterization data the microcontroller 103 is able to compute the compensation voltage that needs to be applied to the varactor 105 to compensate for the temperature induced frequency error. The microcontroller 103 drives the compensation voltage to the DAC 104 which then converts the compensation voltage to a varactor voltage for the varactor 105. The varactor voltage produces the compensating series capacitance for the crystal and the oscillator circuit 107 to generate the reference clock output from the DTCXO. In other embodiments of the present disclosure, the compensation voltage may be applied to a bank of compensation capacitors to selectively switch in the capacitors to compensate for the temperature induced frequency error. In the active compensation mode the microcontroller 103 updates the compensation voltage continually in response to temperature changes sensed by the bandgap temperature sensor 101. However, when an updated compensation voltage is applied to the varactor 105 or the bank of compensation capacitors, the series capacitance for the crystal 106 may be changed, causing discontinuities in the phase, frequency, and/or frequency-rate of the reference clock. Since the receiver subsystem 108 uses the reference clock to generate all its clocks, including clocks used for tracking, any discontinuities in the reference clock will also cause discontinuities in the tracking clock, potentially degrading tracking performance. Therefore, provision is made for the receiver subsystem 108 to operate the DTCXO 109 in the fixed compensation mode through an assertion of the hold compensation signal. When the receiver subsystem 108 asserts the hold compensation signal to the microcontroller 103, the microcontroller will freeze the compensation voltage to the DAC 104 so that the reference clock from the crystal 106 is no longer compensated for any frequency error induced by temperature variation.

Figure 2:
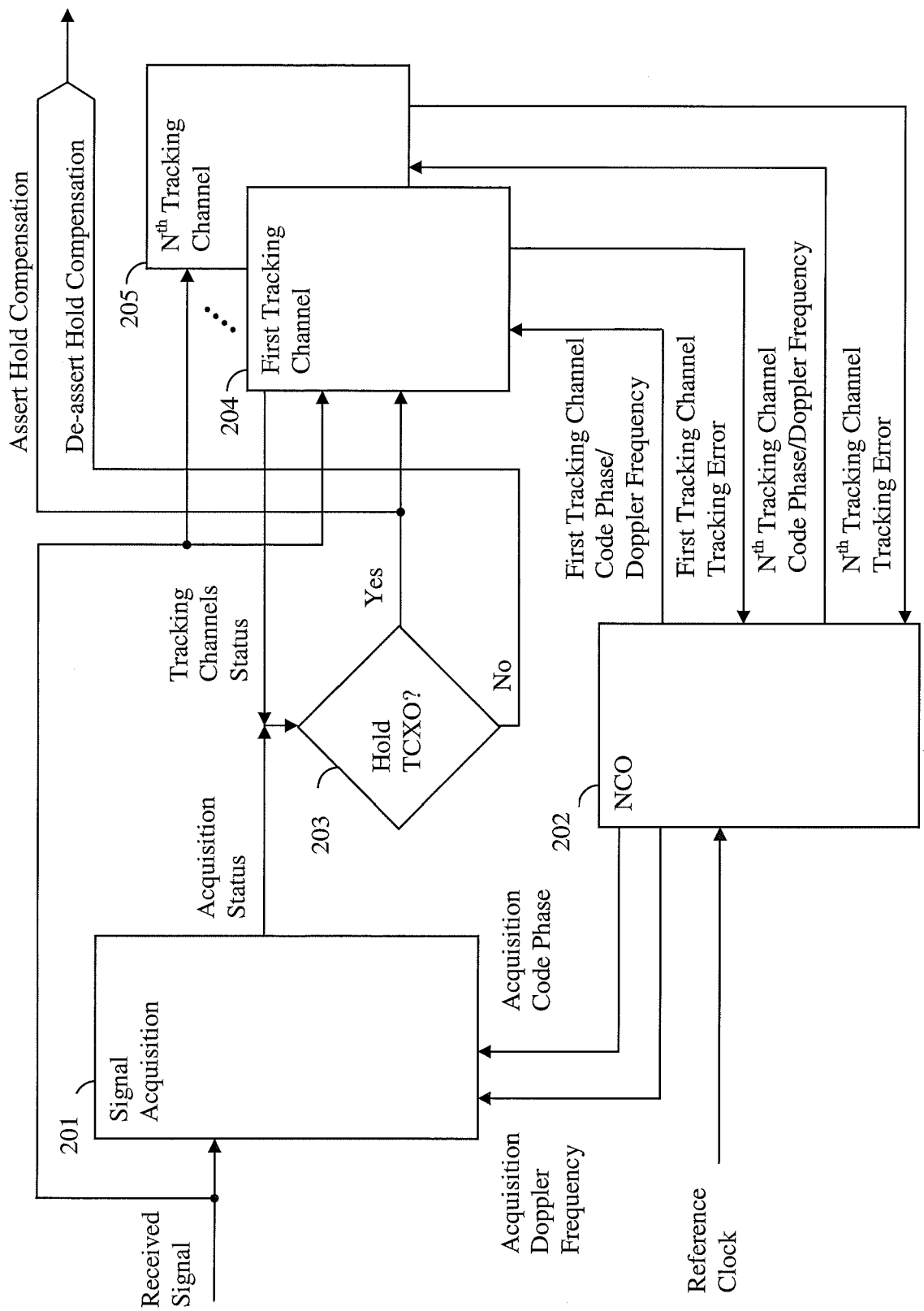
FIG. 2 shows a block diagram of a receiver subsystem of a GPS receiver depicting the generation of a control signal for controlling the operating mode of the switched mode TCXO or VC-TCXO according to one or more embodiments of the present disclosure.

FIG. 2 shows a block diagram of a receiver subsystem of a GPS receiver depicting the generation of the hold compensation signal for controlling the operating mode of the switched mode TCXO or VC-TCXO according to one or more embodiments of the present disclosure. The GPS receiver includes a signal acquisition module 201, an NCO (Numerically Controlled Oscillator) module 202, a decision module 203 to determine whether to put the TCXO in the fixed compensation mode, and a plurality of tracking channels represented by first tracking channel 204 to $N^{th}$ tracking channel 205. The GPS receiver receives the reference clock from the DTCXO of FIG. 1 and generates the hold compensation signal to control the operating mode of the DTCXO. The signal acquisition module 201 performs signal acquisition on the received signals. The received signals are a conglomeration of signals transmitted from the GPS satellites that are visible to the receiver where each satellite signal is modulated with a unique pseudorandom noise (PN) code. Each satellite signal is also shifted by a Doppler frequency due to the relative motion between the satellite and the receiver and also due to the receiver oscillator frequency error. The signal acquisition module 201 detects, or acquires a satellite signal by correlating the received signal with different code phase (shifted versions) of replica of the PN code of the satellite to search for the code phase that yield the maximum correlation. The signal acquisition module 201 also searches for the Doppler frequency on the satellite signal by frequency shifting the satellite signal by the inverse of the different hypothesized Doppler frequency before correlating it with the replica of the PN code. Therefore, acquisition is performed over a two-dimensional search space consisting of a range of code phase and Doppler frequency uncertainties. Signal acquisition is declared when a peak of the magnitude of the correlation for a code phase and a Doppler frequency over the search space exceeds a detection threshold. After acquisition, the satellite signal is handed over to a tracking channel which uses the acquired code phase and Doppler frequency as a starting point to maintain synchronization with the received satellite signal.

Referring to FIG. 2, the NCO module 202 uses the reference clock to generate the code phase of replica of the PN code and the hypothesized Doppler frequency for the signal acquisition module 201. Because signal acquisition searches for the satellite signal over a two dimensional search space of code phase and Doppler frequency uncertainties, it is advantageous to reduce the Doppler frequency uncertainty space in order to speed up acquisition. As mentioned, Doppler frequency is a function of the GPS receiver clock frequency error and the relative motion between the satellite and the receiver. Since the GPS receiver clock is derived from the reference clock, it is desirable to reduce the Doppler frequency uncertainty space to speed up acquisition by operating the DTCXO in the active compensation mode to reduce the range of frequency uncertainty of the reference clock. Signal acquisition measures the correlation peak represented by the magnitude of the correlation over the two-dimensional search space. Operating the DTCXO in the active compensation mode to compensate the reference clock for temperature induced frequency error has the added benefit of yielding a sharper correlation peak because the frequency of the GPS receiver clock is less likely to drift over a wide range during the correlation period. A sharper correlation peak means a higher probability of signal acquisition, contributing further to a speed up of the acquisition. It is known that discontinuities in the phase, frequency, and/or frequency-rate of the reference clock introduced when the TCXO or VC-TCXO compensation voltage is updated may affect the sharpness and magnitude of the correlation peak. However, any negative effect on the shape of the correlation peak when updating the compensation voltage is outweighed by the benefit of a reduced frequency uncertainty search space and is further compensated by a sharper peak resulting from the reduced frequency error. Therefore, operating the DTCXO in the active compensation mode to reduce frequency uncertainty during signal acquisition is highly advantageous.

After a satellite signal has been acquired, the detected PN code phase and Doppler frequency are used to configure the tracking channel for the tracking channel to maintain synchronization with the satellite. Multiple tracking channels such as first tracking channel 204 through $N^{th}$ tracking channel 205 may be used to track multiple satellites and to measure the range to the satellites for determining the location of the GPS receiver. Tracking channel maintains synchronization of the replica PN code with the satellite signal in both code phase and Doppler frequency. A code tracking error is generated from the tracking channel to give an indication of the amount and direction to shift the replica PN code in order to maintain code phase synchronization with the satellite signal. Similarly, a frequency tracking error is generated to give an indication of the amount and direction to adjust the Doppler frequency in order to maintain Doppler frequency synchronization with the satellite signal. The code tracking error and the frequency tracking error are identified for the different tracking channels as first tracking channel tracking error through $N^{th}$ tracking channel tracking error. First tracking channel tracking error through $N^{th}$ tracking channel tracking error may be used by the NCO module 202 to adjust the tracking channel code phase and Doppler frequency to maintain synchronization with the satellite signal.

Tracking channels operate over a narrow range of code phase error and Doppler frequency error. In contrast to signal acquisition, in tracking there is no particular advantage to restricting the frequency change with temperature variation since there is no Doppler frequency uncertainty range to be searched. In addition, in a coherent tracking channel of the GPS receiver the temperature variation is negligible over the short coherent integration period. Furthermore, because tracking channels have to be sensitive to slight deviation in the received code phase or Doppler frequency to maintain synchronization, tracking errors are very sensitive to perturbation in the GPS receiver clock. For example, discontinuities in the phase, frequency, and/or frequency-rate of the reference clock may affect the code tracking error. A resulting degraded code tracking error due to a perturbation in the reference clock when the TCXO compensation voltage is applied may compromise the ability of the tracking channel to maintain code phase synchronization with the satellite signal. Similarly, discontinuities in the reference clock may affect the frequency tracking error. The resulting degraded frequency tracking error may compromise the ability of the tracking channel to adjust the Doppler frequency to maintain Doppler frequency synchronization with the satellite signal. Therefore, it may be desirable to operate the TCXO or the VC-TCXO in the fixed compensation mode when tracking signal to prevent discontinuities in the reference clock.

Control of the operating modes of the switched mode TCXO or VC-TCXO to switch between the active compensation mode and the fixed compensation mode is now described. During signal acquisition of the first satellite signal, the hold compensation signal is not asserted so as to operate the DTCXO in the active compensation mode. When the first satellite has been acquired, the detected PN code phase and Doppler frequency are used to configure the first tracking channel 204 to track the first satellite signal. While the first tracking channel 204 operates to maintain synchronization with the first satellite signal, the signal acquisition module 201 may continue to operate to acquire a second satellite signal. During the acquisition of the second and subsequent satellite signals, the TCXO may continue to operate in the active compensation mode to speed up signal acquisition. In order to minimize perturbation of the reference clock on the tracking error from the first tracking channel, the TCXO or VC-TCXO compensation voltage may be applied between periods of coherent integrations. This may be accomplished by the decision module 203 asserting the hold compensation signal during periods of coherent integration of the first tracking channel and de-asserting the hold compensation signal otherwise. Thus, the decision module may monitor an acquisition status signal from the acquisition module 201 and tracking channel status signals from the tracking channels to determine when to assert and de-assert the hold compensation signal. After the second satellite is acquired, the detected PN code phase and Doppler frequency are similarly used to configure a second tracking channel to track the second satellite signal. Acquisition continues until there are a sufficient number of satellites to allow a navigation solution to be generated. At this time, the decision module 203 may statically assert the hold compensation signal to switch the DTCXO from the active compensation mode to the fixed compensation mode, whereupon the reference clock is no longer compensated for temperature variation.

In other embodiments, static assertion of the hold compensation signal may start earlier. Similar to the Doppler frequency of the first acquired satellite, the Doppler frequency of the second satellite is due to the relative motion between the second satellite and the receiver and also due to a receiver oscillator frequency error. However, the receiver oscillator frequency error component is common to the Doppler frequencies of all the satellites. Since the common receiver oscillator frequency error may be resolved from the signal acquisition of the first satellite, the Doppler frequency uncertainty search space for the subsequent satellite may be reduced. Thus, there may not be any advantage to continue operating the DTCXO in the active compensation mode to reduce the Doppler frequency uncertainty search space when acquiring the later satellites, especially for satellite with strong signal. Therefore, the decision module 203 may statically assert the hold compensation signal before all the satellites have been acquired.

Therefore, the switched mode TCXO or VC-TCXO gives the receiver the flexibility to operate the TCXO or VC-TCXO in the active compensation mode when receiver performance may be improved from a reduction in the range of oscillator frequency error, such as during signal acquisition, and when the receiver is able to withstand discontinuities in the reference clock when the compensation voltage is applied. The switched mode TCXO or VC-TCXO may then be switched to allow the receiver to operate the TCXO or VC-TCXO in the fixed compensation mode when it is more critical to prevent clock discontinuities, such as during coherent tracking of GPS satellite signals when the tracking error is sensitive to clock perturbation.

Figure 3:
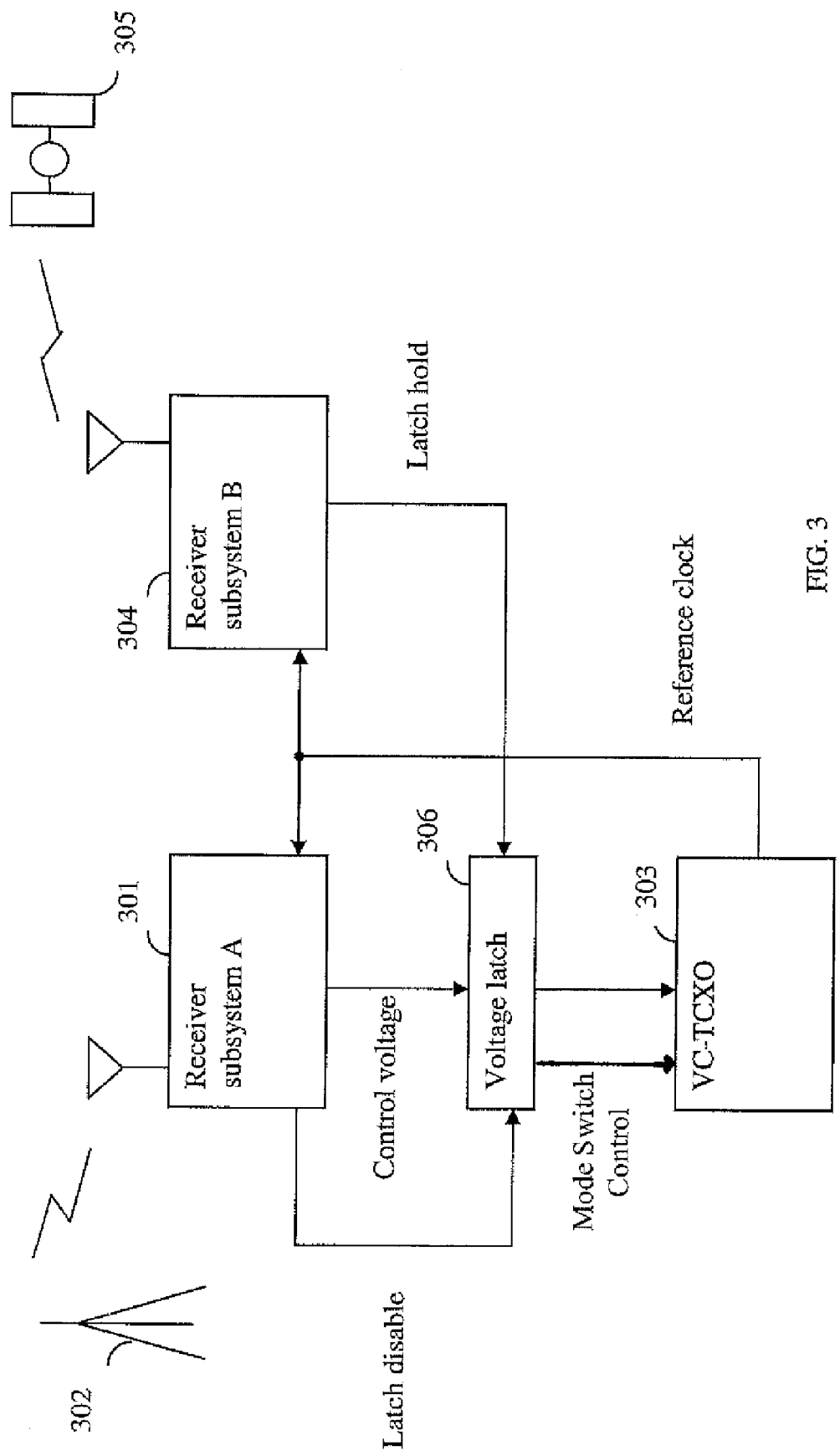
FIG. 3 shows a top level block diagram of a receiver depicting a switched mode voltage controlled TCXO (VC-TCXO) under the control of a receiver according to one or more embodiments of the present disclosure.

FIG. 3 shows a top level block diagram of a receiver depicting a switched mode VC-TCXO under the control of a receiver according to one or more embodiments of the present disclosure. The receiver has two receiver subsystems, receiver subsystem A 301 and receiver subsystem B 304, sharing a reference clock from the VC-TCXO 303. Receiver subsystems A 301 and B 304 use the common reference clock to generate their respective subsystem clocks. Example of such a receiver is a cellular phone with GPS capability where there is a cellular subsystem to interface with a cellular network and a GPS subsystem to receive signal from GPS satellites where the system clocks for the cellular subsystem and the GPS subsystem derive from a common reference clock. A VC-TCXO offers the added functionality of a voltage control input to control the frequency of the reference clock in addition to compensating for temperature-induced frequency variation.

Referring to FIG. 3, receiver subsystem A 301 controls the VC-TCXO 303 to generate the reference clock to maintain communication with a tower of a frequency-controlling network 302. When there is a change in the carrier frequency of the frequency-controlling network 302, such as when switching between towers, the receiver subsystem A 301 varies the control voltage to the VC-TCXO 303 to induce a frequency or phase change of the reference clock in order to maintain communication with the new carrier frequency. In a TDMA (time division multiple access) network, change in the reference clock may be applied between known transmit or receive time slots without affecting the performance of receiver subsystem A.

Receiver subsystem B 304 also uses the reference clock from the VC-TCXO 303 to receive signal from a satellite network 305. Satellite network 305 operates independently from the frequency-controlling network 302. To avoid discontinuities on the reference clock induced by receiver subsystem A 301 changing the control voltage to the VC-TCXO 303 from degrading performance of subsystem B 304 a voltage latch 306 is provided. Control voltage from receiver subsystem A 301 goes through the voltage latch 306. Receiver subsystem B 304 generates a latch hold signal to control the voltage latch 306. When receiver subsystem B 304 does not assert the latch hold, voltage latch 306 operates in the transparent mode. Change on the control voltage from receiver subsystem A 301 passes through the voltage latch 306 to the VC-TCXO 303 to change the reference clock. On the other hand, when receiver subsystem B 304 asserts the latch hold, voltage latch 306 operates in the latched mode. Voltage latch 306 holds its present value and any change on the control voltage from receiver subsystem A 301 does not pass through to the VC-TCXO 303. Thus, receiver subsystem B 304 may assert the latch hold to prevent discontinuities on the reference clock for critical time periods such as during coherent integration intervals.

In another embodiment, receiver subsystem A 301 may generate a latch disable to override the latch hold from receiver subsystem B 304. Receiver subsystem A 301 may assert the latch disable when it needs immediate response from the VC-TCXO 303 and when it needs to prevent subsystem B 304 from interfering with changes on the control voltage. Thus, receiver subsystem A may assert the latch disable to force the voltage latch 306 to be in the transparent mode regardless of the state of the latch hold. When receiver subsystem A no longer needs immediate response from the VC-TCXO 303, it may release the latch disable to allow receiver subsystem B 304 to assert the latch hold to delay change on the reference clock for improved performance of receiver subsystem B 304.

In another embodiment, the VC-TCXO 303 may have a hold compensation signal, similar to that in the TCXO of FIG. 1, to put the VC-TCXO in the active compensation mode or the fixed compensation mode. The hold compensation signal may be controlled by the latch hold from subsystem B 304. Therefore, when the VC-TCXO is in the latched mode it is also in the fixed compensation mode so that there are no discontinuities on the reference clock due to temperature compensation. Conversely, when the VC-TCXO is in the transparent mode it is also in the active compensation mode.

In another embodiment, the latch disable from subsystem A together with the latch hold from subsystem B may control the hold compensation signal in addition to controlling the voltage latch 306. Consequently, the latch disable may override the latch hold so that the VC-TCXO is in the fixed compensation mode only when it is also in the latched mode and in the active compensation mode when it is also in the transparent mode.

Although embodiments of the present disclosure have been described, these embodiments illustrate but do not limit the disclosure. It should also be understood that embodiments of the present disclosure should not be limited to these embodiments but that numerous modifications and variations may be made by one of ordinary skill in the art in accordance with the principles of the present disclosure and be included within the spirit and scope of the present disclosure as hereinafter claimed.

The invention claimed is:

1. A switched mode temperature compensated crystal oscillator (TCXO) compromising:
   a TCXO to generate a reference clock;
   a mode switch signal adapted to control an operating mode of the TCXO;
   wherein when the mode switch signal is set to an active compensation mode the TCXO compensates the reference clock for changes induced by temperature variations, and when the mode switch signal is set to a fixed compensation mode the TCXO does not compensate the reference clock for changes induced by temperature variations; and
   a satellite navigation receiver adapted to control the mode switch signal, wherein the satellite navigation receiver includes a signal acquisition module to acquire satellite signals using the reference clock and a plurality of tracking channels to coherently track the satellite signals using the reference clock, wherein the signal acquisition module and the plurality of tracking channels operate in parallel and the mode switch signal is controlled to aid the signal acquisition module without causing discontinuities in the reference clock when at least one of the tracking channels is coherently tracking.

2. The switched mode TCXO of claim 1, wherein the satellite navigation receiver sets the mode switch signal to the active compensation mode when the signal acquisition module acquires satellite signals, and to the fixed compensation mode when a sufficient number of satellite signals are acquired to allow a navigation solution.

3. The switched mode TCXO of claim 1, wherein the satellite navigation receiver sets the mode switch signal to the active compensation mode when the signal acquisition module acquires satellite signals, and to the fixed compensation mode before a sufficient number of satellite signals are acquired to allow a navigation solution.

4. A system compromising:
   a switched mode voltage controlled temperature compensated crystal oscillator (VC-TCXO) to generate a reference clock from a VC-TCXO control voltage;
   a voltage latch to generate the VC-TCXO control voltage from an input control voltage, the voltage latch receiving a latch hold signal;
   a first receiver sub-system configured to maintain communication with a cellular network, wherein if the cellular network changes a carrier frequency, the first receiver sub-system varies the input control voltage to induce a change in the reference clock to maintain communication with the changed carrier frequency; and
   a second receiver sub-system configured to use the reference clock to receive signals from a satellite network, the second receiver sub-system being further configured to assert the latch hold signal to avoid discontinuities in the reference clock;
   wherein when the latch hold signal is de-asserted, the voltage latch makes the VC-TCXO control voltage follow the input control voltage, and when the latch hold signal is asserted, the voltage latch holds the VC-TCXO control voltage to a previous voltage of the voltage latch before the latch hold is asserted irrespective of the input control voltage.

5. The system of claim 4,
   wherein the second receiver sub-system asserts the latch hold signal during periods of coherent integration input.

6. The system of claim 4, further comprising a latch disable signal coupled to the voltage latch, wherein when the latch disable is asserted, the latch hold signal has no effect, and when the latch disable signal is de-asserted, the latch hold signal has effect.

7. The system switched mode VC-TCXO of claim 6, wherein the first receiver sub-system is configured to control the latch disable signal.

8. A method of operating a switched mode temperature compensated crystal oscillator (TCXO) in a satellite navigation receiver comprising:
   operating the switched mode TCXO in an active compensation mode to reduce changes in frequency of a reference clock from the switched mode TXCO responsive to changes in temperature to aid the satellite navigation receiver to acquire satellite signals using the reference clock;
   waiting for a condition to switch the switched mode TCXO out of the active compensation mode, wherein the condition includes discontinuities in the reference clock when the satellite navigation receiver is coherently tracking; and
   switching the switched mode TCXO to operate in a fixed compensation mode so as not to compensate for changes in frequency of the reference clock responsive to changes in temperature.

9. The method of claim 8, wherein the waiting comprises waiting for the satellite navigation receiver to acquire a sufficient number of satellite signals to allow a navigation solution.

* * * * *